US011784570B2

(12) United States Patent
Wu et al.

(10) Patent No.: US 11,784,570 B2
(45) Date of Patent: Oct. 10, 2023

(54) POWER PATH SWITCH CIRCUIT

(71) Applicant: Richtek Technology Corporation, Zhubei (TW)

(72) Inventors: Hsin-Yi Wu, Hsinchu (TW); Chien-Fu Tang, Hsinchu (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 340 days.

(21) Appl. No.: 17/367,568

(22) Filed: Jul. 5, 2021

(65) Prior Publication Data

US 2022/0060116 A1 Feb. 24, 2022

Related U.S. Application Data

(60) Provisional application No. 63/068,980, filed on Aug. 21, 2020.

(30) Foreign Application Priority Data

Dec. 4, 2020 (TW) .................................. 109142813

(51) Int. Cl.
*H02M 3/335* (2006.01)
*H02M 7/217* (2006.01)
*H01L 29/78* (2006.01)
*H03K 17/082* (2006.01)
*G01R 19/00* (2006.01)

(52) U.S. Cl.
CPC .... *H02M 3/33507* (2013.01); *G01R 19/0092* (2013.01); *H01L 29/7803* (2013.01); *H01L 29/7816* (2013.01); *H03K 17/0822* (2013.01)

(58) Field of Classification Search
CPC ............... H02M 1/0009; H02M 3/335; H02M 3/33507; H02M 3/33576; H02M 3/33592; H02M 7/12; H02M 7/21; H02M 7/217
See application file for complete search history.

(56) References Cited

U.S. PATENT DOCUMENTS

| | | | |
|---|---|---|---|
| 2014/0254220 A1* | 9/2014 | George | H02M 7/217 363/89 |
| 2014/0320095 A1 | 10/2014 | Sambucco | |
| 2017/0317669 A1* | 11/2017 | Kaeriyama | H03K 17/0828 |
| 2022/0131475 A1* | 4/2022 | Lin | H02M 3/33592 |
| 2022/0393563 A1* | 12/2022 | Yajima | H02M 1/0009 |

FOREIGN PATENT DOCUMENTS

EP 3945324 A1 * 2/2022

\* cited by examiner

*Primary Examiner* — Gary L Laxton
(74) *Attorney, Agent, or Firm* — Tung & Associates

(57) ABSTRACT

A power path switch circuit includes: a power transistor unit including: a first vertical double-diffused metal oxide semiconductor (VDMOS) device, wherein a first current outflow end of the first VDMOS device is coupled to an output end of a power path; and a second VDMOS device, wherein a first current inflow end of the first VDMOS device and a second current inflow end of the second VDMOS device are coupled with a supply end of the power path; and a voltage locking circuit coupled to the first current outflow end and the second current outflow end, for locking a voltage at the second current outflow end to a voltage at the first current outflow end, so that there is a predetermined ratio between a first conductive current flowing through the first VDMOS device and a second conductive current flowing through the second VDMOS device.

6 Claims, 4 Drawing Sheets

POWER PATH SWITCH CIRCUIT

CROSS REFERENCE

The present invention claims priority to U.S. 63/068,980 filed on Aug. 21, 2020 and claims priority to TW 109142813 filed on Dec. 4, 2020 and.

BACKGROUND OF THE INVENTION

Field of Invention

The present invention relates to a power path switch circuit; particularly, it relates to such power path switch circuit capable of reducing the layout area of a printed circuit board (PCB).

Description of Related Art

Please refer to FIG. 1, which shows a schematic diagram of a conventional secondary side circuit of a flyback power supply circuit. As shown in FIG. 1, the conventional secondary side circuit of a flyback power supply circuit employs a resistor Rcs to detect a secondary side current and employs a transistor bMOS to switch current. To detect the secondary side current accurately, the resistor Rcs needs to have a highly accurate resistance, so the cost is high. Besides, the prior art shown in FIG. 1 has another drawback that the PCB needs to provide a space for accommodating the resistor Rcs.

In view of the above, to overcome the drawbacks in the prior art, the present invention proposes an innovated power path switch circuit.

SUMMARY OF THE INVENTION

From one perspective, the present invention provides a power path switch circuit, which is configured to operably control conduction of a power path; the power path switch circuit comprising: a power transistor unit, which is coupled between a supply end and an output end of the power path, wherein the power transistor unit includes: a first vertical double-diffused metal oxide semiconductor (VDMOS) device having a first current inflow end, a first current outflow end and a first control end, wherein the first current inflow end is coupled to the supply end; wherein the first current outflow end is coupled to the output end; wherein the first control end is configured to operably receive a control signal, whereby the conduction of the power path is controlled according to the control signal; and a second VDMOS device having a second current inflow end, a second current outflow end and a second control end, wherein the second current inflow end is coupled to the supply end, and wherein the second control end is configured to operably receive the control signal; and a voltage locking circuit, which is coupled to the first current outflow end and the second current outflow end, wherein the voltage locking circuit is configured to operably lock a voltage at the second current outflow end at a voltage at the first current outflow end, so that there is a predetermined ratio between a first conductive current flowing through the first VDMOS device and a second conductive current flowing through the second VDMOS device.

In one embodiment, the voltage locking circuit includes: an error amplifier having a non-inverting input end and an inverting input end, which are coupled to the first current outflow end and the second current outflow end, respectively; a lateral double-diffused metal oxide semiconductor (LDMOS) device having a gate coupled to an output end of the error amplifier, wherein a third current inflow end of the LDMOS device is coupled to the second current outflow end; and a current sensing device, which is coupled between a third current outflow end of the LDMOS device and a ground level, wherein the current sensing device is configured to operably supply a current sensing signal to indicate a level of the first conductive current.

In one embodiment, both the power transistor unit and the voltage locking circuit are integrated circuits, and wherein the power transistor unit and the voltage locking circuit are packaged in a multi-chip module (MCM).

In one embodiment, the power path is used in a secondary side circuit of a flyback power supply circuit.

In one embodiment, the power path is used in a communication protocol circuit, wherein the protocol circuit and a load circuit are configured to operably communicate with each other via a communication protocol to determine whether to conduct or not conduct the power path, wherein the power path is configured to supply a power to the load circuit.

In one embodiment, the predetermined ratio of the first conductive current to the second conductive current is M:1, wherein M is a positive real number.

The present invention is particularly advantageous in that: because the resistor Rcs and the transistor bMOS can be omitted, the present invention can effectively reduce the layout area of a printed circuit board (PCB), thus reducing a size of the transformer.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 2:
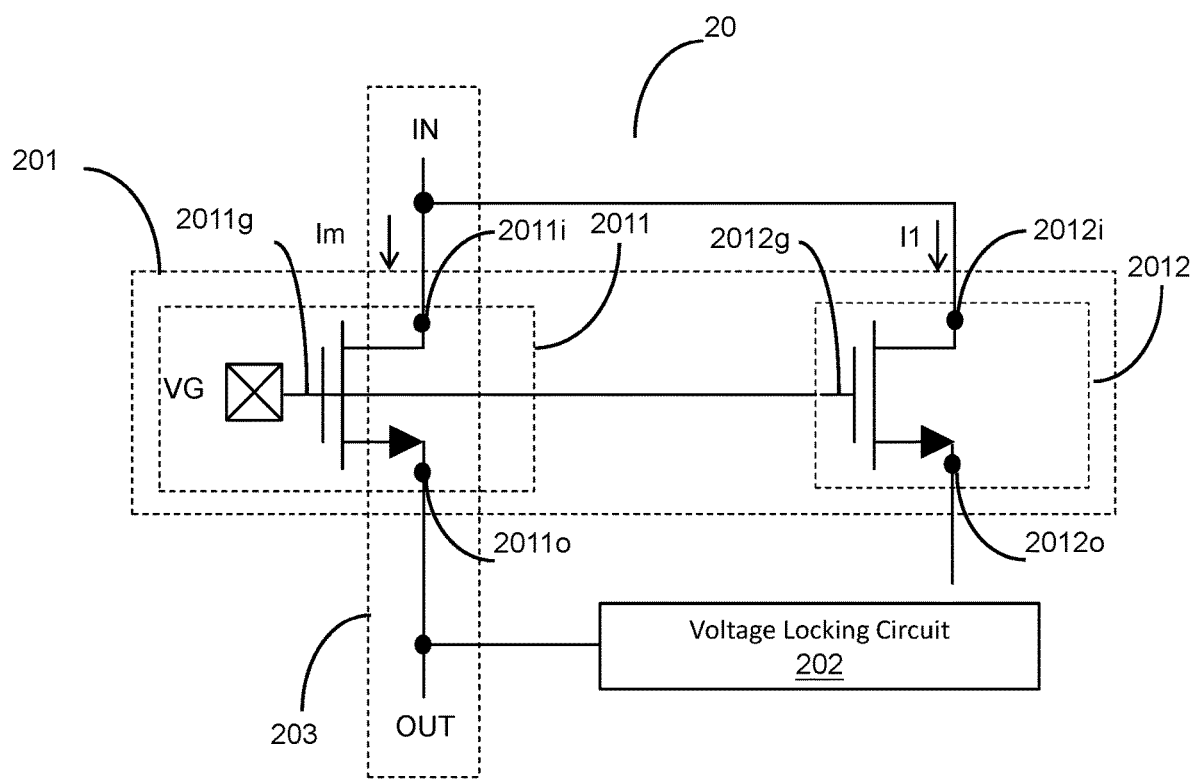
FIG. 2 shows a schematic diagram of a power path switch circuit according to an embodiment of the present invention.

Please refer to FIG. 2, which shows a schematic diagram of a power path switch circuit according to an embodiment of the present invention. The power path switch circuit 20 of the present invention can be applied to controlling any type of power path 203. As shown in FIG. 2, the power path switch circuit 20 comprises: a power transistor unit 201 and a voltage locking circuit 202. The power transistor unit 201 is coupled between a supply end IN and an output end OUT of the power path 203.

The power transistor unit 201 includes: a first vertical double-diffused metal oxide semiconductor (VDMOS)

device 2011 and a second VDMOS device 2012. The first VDMOS device 2011 has a first current inflow end 2011$i$, a first current outflow end 2011$o$ and a first control end 2011$g$. The first current inflow end 2011$i$ is coupled to the supply end IN, whereas, the first current outflow end 2011$o$ is coupled to the output end OUT. The first control end 2011$g$ is configured to operably receive a control signal VG, whereby the conduction of the power path 203 is controlled according to the control signal VG.

The second VDMOS device 2012 has a second current inflow end 2012$i$, a second current outflow end 2012$o$ and a second control end 2012$g$. The second current inflow end 2012$i$ is coupled to the supply end IN, whereas, the second current outflow end 2012$o$ is coupled to the output end OUT. The second control end 2012$g$ is configured to operably receive the control signal VG.

The voltage locking circuit 202 is coupled to the first current outflow end 2011$o$ and the second current outflow end 2012$o$, so as to lock a voltage at the second current outflow end 2012$o$ at a voltage at the first current outflow end 2011$o$, wherein the first current outflow end 2011$o$ and the second current outflow end 2012$o$ are not directly electrically connected to each other. Thus, a predetermined ratio is established between a first conductive current Im flowing through the first VDMOS device 2011 and a second conductive current I1 flowing through the second VDMOS device 2012. That is, because the current inflow ends of the first VDMOS device 2011 and the second VDMOS device 2012 (i.e., the first current inflow end 2011$i$ and the second current inflow end 2012$i$) are electrically connected to each other, and the control ends of the first VDMOS device 2011 and the second VDMOS device 2012 (i.e., the first control end 2011$g$ and the second control end 2012$g$) are electrically connected to each other (i.e., both the first control end 2011$g$ and the second control end 2012$g$ receive the control signal VG), and furthermore the current outflow ends of the first VDMOS device 2011 and the second VDMOS device 2012 (i.e., the first current outflow end 2011$o$ and the second current outflow end 2012$o$), which are not directly electrically connected to each other, are locked at a same voltage via the voltage locking circuit 202, a predetermined ratio is established between the first conductive current Im and the second conductive current I1. In one embodiment, the predetermined ratio of the first conductive current Im to the second conductive current I1 is M:1, wherein M is a positive real number. In one embodiment, M can be, for example but not limited to, a positive real number greater than 100. In one preferred embodiment, M can be, for example but not limited to, 2000 or 500.

In one embodiment, both the power transistor unit 201 and the voltage locking circuit 202 are integrated circuits. In one embodiment, preferably, the power transistor unit 201 and the voltage locking circuit 202 can be packaged in a multi-chip module (MCM). As described above, the power path switch circuit 20 of the present invention can be applied to controlling any type of power path 203. For example, in one embodiment, the power path 203 can be one which is used in a secondary side circuit of a flyback power supply circuit. In another embodiment, the power path 203 can be one which is used in a communication protocol circuit, wherein the protocol circuit and a load circuit are configured to operably communicate with each other via a communication protocol to determine whether to conduct or not conduct the power path 203, and to generate the control signal VG accordingly, wherein the power path 203 is configured to operably supply a power to the load circuit. In yet another embodiment, the power path 203 can be one which is used in an AC/DC (alternating-current/direct-current) conversion circuit.

Figure 1:
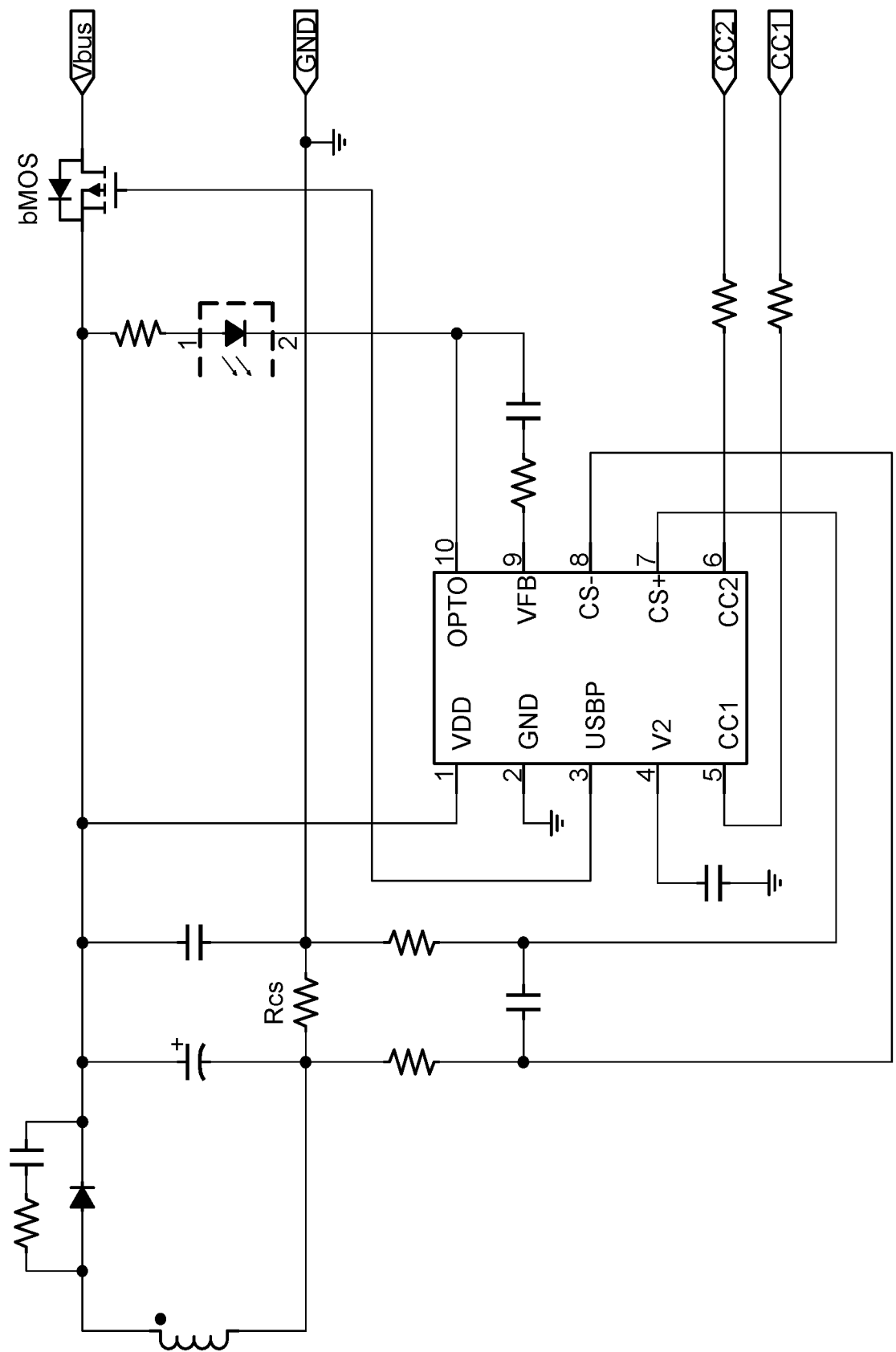
FIG. 1 shows a schematic diagram of a conventional secondary side circuit of a flyback power supply circuit.
Figure 3:
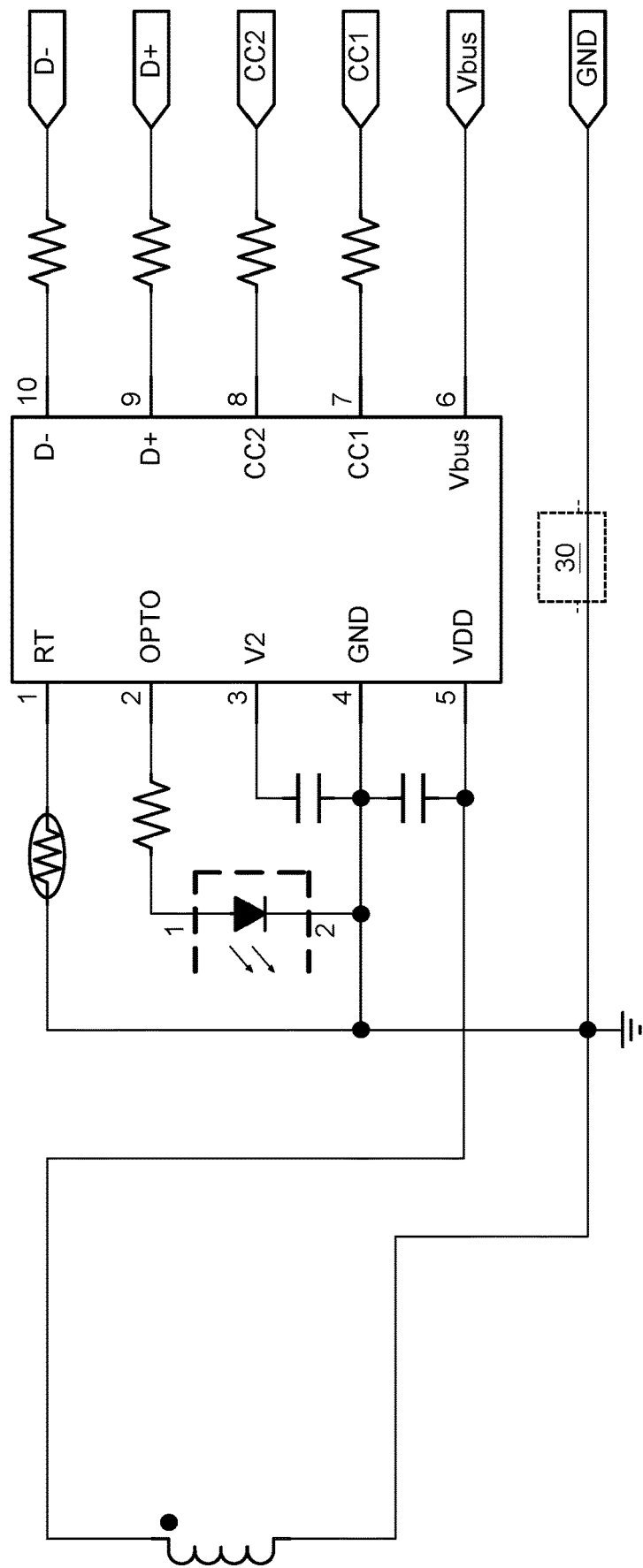
FIG. 3 shows a schematic diagram of a secondary side circuit of a flyback power supply circuit according to an embodiment of the present invention.

Please refer to FIG. 3, which shows a schematic diagram of a secondary side circuit of a flyback power supply circuit according to an embodiment of the present invention. This embodiment shown in FIG. 3 is an example showing that the power path switch circuit 30 is applied to a secondary side circuit of a flyback power supply circuit. In one embodiment, the power path switch circuit 30 and the secondary side circuit can be integrated into one chip module. As a result, the resistor Rcs and the transistor bMOS (blocking MOS) (referring to FIG. 1) can be omitted, whereby the present invention can reduce the layout area of the printed circuit board (PCB), and can save manufacturing cost. In another embodiment, it is also practicable and within the scope of the present invention to integrate the voltage locking circuit 202 of the power path switch circuit 30 into the integrated circuit of the secondary side circuit, whereas, the power transistor unit 201 of the power path switch circuit 30 is located outside from the above-mentioned integrated circuit.

Figure 4:
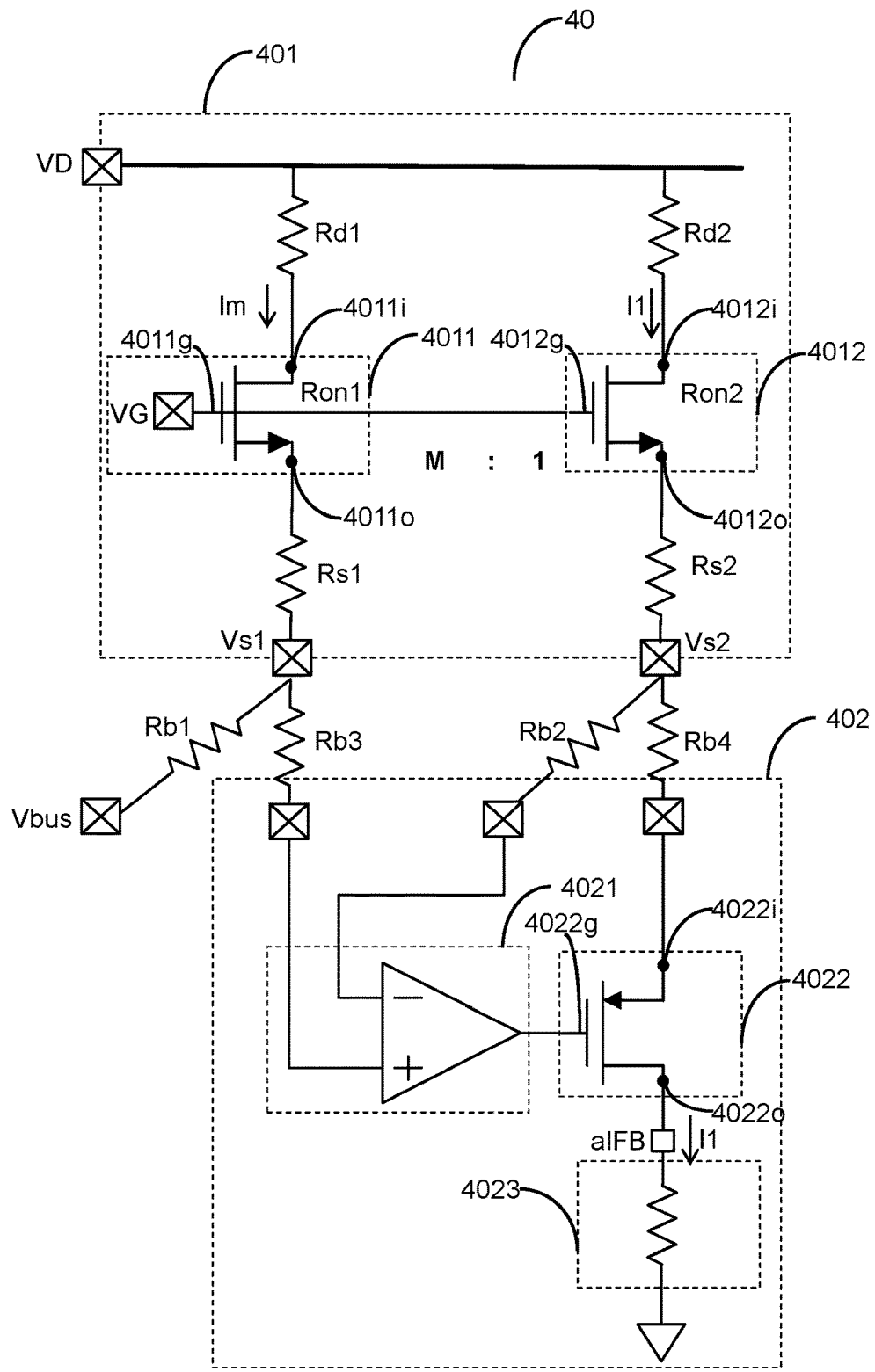
FIG. 4 shows an embodiment where a power path switch circuit is used in a secondary side circuit of a flyback power supply circuit.

Please refer to FIG. 4, which shows an embodiment wherein a power path switch circuit is applied to a secondary side circuit of a flyback power supply circuit. As shown in FIG. 4, the power path switch circuit 40 of the present invention can be used to control a power path from a supply end VD to a voltage bus Vbus. The power path switch circuit 40 comprises: a power transistor unit 401 and a voltage locking circuit 402. In one embodiment, the voltage locking circuit 402 is located inside a controller of a secondary side circuit of a flyback power supply circuit. The power transistor unit 401 is coupled between the supply end VD of the power path and an output end Vs of the controller of the secondary side circuit. The supply end VD shown in FIG. 4 for example corresponds to the pin VDD shown in FIG. 3.

In one embodiment, the power transistor unit 401 includes: a first vertical double-diffused metal oxide semiconductor (VDMOS) device 4011 and a second VDMOS device 4012. The first VDMOS device 4011 has a first current inflow end 4011$i$, a first current outflow end 4011$o$ and a first control end 4011$g$. The first current inflow end 4011$i$ is coupled to the supply end VD via an equivalent resistance Rd1 at a drain of the first VDMOS device 4011, whereas, the first current outflow end 4011$o$ is coupled to the output end Vs1 via an equivalent resistance Rs1 at a source of the first VDMOS device 4011. The first control end 4011$g$ is configured to operably receive a control signal VG, whereby the conduction of the power path is controlled according to the control signal VG. The second VDMOS device 4012 has a second current inflow end 4012$i$, a second current outflow end 4012$o$ and a second control end 4012$g$. The second current inflow end 4012$i$ is coupled to the supply end VD via an equivalent resistance Rd2 at a drain of the second VDMOS device 4012, whereas, the second current outflow end 4012$o$ is coupled to the output end Vs2 via an equivalent resistance Rs2 at a source of the second VDMOS device 4012. The second control end 4012$g$ is configured to operably receive a control signal VG. In one embodiment, there is a specific proportional relationship between the equivalent resistance Rd1 and the equivalent resistance Rd2. In one embodiment, there is a predetermined proportional relationship between the equivalent resistance Rs1 and the equivalent resistance Rs2. In one embodiment, there is a predetermined proportional relationship between a channel resistance Ron1 of the first VDMOS device 4011 and a channel resistance Ron2 of the second VDMOS device 4012.

As shown in FIG. 4, in this embodiment, the voltage locking circuit 402 is coupled to the first current outflow end 4011o and the second current outflow end 4012o, and the first current outflow end 4011o and the second current outflow end 4012o are not directly electrically connected to each other. The voltage locking circuit 402 is configured to operably lock a voltage at the second current outflow end 4012o at a voltage at the first current outflow end 4011o, so that there is a predetermined ratio between a first conductive current Im flowing through the first VDMOS device 4011 and a second conductive current I1 flowing through the second VDMOS device 4012. In one embodiment, the predetermined ratio of the first conductive current Im to the second conductive current I1 is M:1, wherein M is a positive real number. In one embodiment, M can be, for example but not limited to, a positive real number greater than 100. In one preferred embodiment, M can be, for example but not limited to, 2000 or 500.

As shown in FIG. 4, in this embodiment, the voltage locking circuit 402 can include: an error amplifier 4021, a lateral double-diffused metal oxide semiconductor (LDMOS) device 4022 and a current sensing device 4023. The error amplifier 4021 has a non-inverting input end and an inverting input end, which are coupled to the first current outflow end 4011o via a resistor Rb3 and the second current outflow end 4012o via a resistor Rb2, respectively. Because the first current outflow end 4011o is coupled to the non-inverting input end of the error amplifier 4021 and the second current outflow end 4012o is coupled to the inverting input end of the error amplifier 4021, by loop feedback balance mechanism, the first current outflow end 4011o and the second current outflow end 4012o are locked at a same voltage.

Still referring to FIG. 4, in this embodiment, a gate 4022g of the LDMOS device 4022 is coupled to an output end of the error amplifier 4021, and a third current inflow end 4022i of the LDMOS device 4022 is coupled to the second current inflow end 4012o via a resistor Rb4. The current sensing device 4023 is coupled between a third current outflow end 4022o of the LDMOS device 4022 and a ground level. The current sensing device 4023 is configured to operably supply a current sensing signal, wherein the current sensing signal is indicative of the second conductive current I1. Because there is a predetermined ratio between the first conductive current Im and the second conductive current I1, the level of the first conductive current Im can be obtained according to the predetermined ratio between the first conductive current Im and the second conductive current I1. That is, the current sensing signal can indicate the level of the first conductive current Im. In the present invention, the voltage locking and the current sensing are performed through different nodes and different paths by means of Kelvin Sense approach, which can prevent a parasitic device (e.g., a parasitic resistor, etc.) from affecting the accuracies of the voltage locking and the current sensing operations. As shown in FIG. 4, the voltage bus Vbus is coupled to the first current outflow end 4011o via a resistor Rb1. Under such configuration, this embodiment can detect currents via the current sensing device 4023 and detect voltages via the voltage bus Vbus.

In one embodiment, both the power transistor unit 401 and the voltage locking circuit 402 can be integrated circuits. In one embodiment, preferably, the power transistor unit 401 and the voltage locking circuit 402 can be formed in separate chips, and the power transistor unit 401 and the voltage locking circuit 402 can be packaged in a multi-chip module (MCM). It is noteworthy that, in one embodiment, the resistors Rb1-Rb4 shown in FIG. 4 can be the parasitic resistors of bonding wires, and the cross-square symbols which are respectively connected to two ends of the corresponding resistors Rb1-Rb4 in FIG. 4 can be bonding pads of the chip or of the lead frame. Moreover, the equivalent resistances Rs1-Rs2 and Rd1-Rd2 can respectively be corresponding parasitic resistors at a source or a drain of the corresponding VDMOS devices. In one embodiment, the above-mentioned parasitic resistors may include the parasitic resistors of metallic lines in the layout of a chip.

Note that the power path switch circuit of the present invention can be applied to controlling any type of power path. For example, in one embodiment, the power path can be one which is used in a secondary side circuit of a flyback power supply circuit. In another embodiment, the power path can be one which is used in a communication protocol circuit, wherein the protocol circuit and a load circuit are configured to operably communicate with each other via a communication protocol to determine whether to conduct or not conduct of the power path, and generate the control signal VG accordingly, wherein the power path is configured to operably supply a power to the load circuit. In yet another embodiment, the power path can be one which is used in an AC/DC (alternating-current/direct-current) converter circuit.

As described above, the present invention is advantageous in that: because the resistor Rcs and the transistor bMOS can be omitted from the power path switch circuit of the present invention, the present invention can reduce the layout area of a printed circuit board (PCB), thus reducing the size of a transformer.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A power path switch circuit, which is configured to operably control conduction of a power path; the power path switch circuit comprising:

a power transistor unit, which is coupled between a supply end and an output end of the power path, wherein the power transistor unit includes:
- a first vertical double-diffused metal oxide semiconductor (VDMOS) device having a first current inflow end, a first current outflow end and a first control end, wherein the first current inflow end is coupled to the supply end; wherein the first current outflow end is coupled to the output end; wherein the first control end is configured to operably receive a control signal, whereby the conduction of the power path is controlled according to the control signal; and
- a second VDMOS device having a second current inflow end, a second current outflow end and a second control end, wherein the second current inflow end is coupled to the supply end, and wherein the second control end is configured to operably receive the control signal; and a voltage locking circuit, which is coupled to the first current outflow end and the second current outflow end, wherein the voltage locking circuit is configured to operably lock a voltage at the second current outflow end at a voltage at the first current outflow end, so that there is a predetermined ratio between a first conductive current flowing through the first VDMOS device and a second conductive current flowing through the second VDMOS device.

2. The power path switch circuit of claim 1, wherein the voltage locking circuit includes:
- an error amplifier having a non-inverting input end and an inverting input end, which are coupled to the first current outflow end and the second current outflow end, respectively;
- a lateral double-diffused metal oxide semiconductor (LDMOS) device having a gate coupled to an output end of the error amplifier, wherein a third current inflow end of the LDMOS device is coupled to the second current outflow end; and
- a current sensing device, which is coupled between a third current outflow end of the LDMOS device and a ground level, wherein the current sensing device is configured to operably supply a current sensing signal to indicate a level of the first conductive current.

3. The power path switch circuit of claim 1, wherein both the power transistor unit and the voltage locking circuit are integrated circuits, and wherein the power transistor unit and the voltage locking circuit are packaged in a multi-chip module (MCM).

4. The power path switch circuit of claim 1, wherein the power path is used in a secondary side circuit of a flyback power supply circuit.

5. The power path switch circuit of claim 1, wherein the power path is used in a communication protocol circuit, wherein the protocol circuit and a load circuit are configured to operably communicate with each other via a communication protocol to determine whether to conduct or not conduct the power path, wherein the power path is configured to supply a power to the load circuit.

6. The power path switch circuit of claim 1, wherein the predetermined ratio of the first conductive current to the second conductive current is M:1, wherein M is a positive real number.

\* \* \* \* \*